United States Patent
Garni et al.

(10) Patent No.: US 6,894,937 B2
(45) Date of Patent: May 17, 2005

(54) ACCELERATED LIFE TEST OF MRAM CELLS

(75) Inventors: Bradley J. Garni, Austin, TX (US); Thomas W. Andre, Austin, TX (US); Joseph J. Nahas, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 54 days.

(21) Appl. No.: 10/672,959

(22) Filed: Sep. 26, 2003

(65) Prior Publication Data

US 2005/0068815 A1 Mar. 31, 2005

(51) Int. Cl.[7] .............................................. G11C 29/00
(52) U.S. Cl. ............. 365/201; 365/189.09; 365/185.23; 327/530
(58) Field of Search ............................ 365/201, 189.09, 365/185.23; 327/530

(56) References Cited

U.S. PATENT DOCUMENTS

| | | | |
|---|---|---|---|
| 6,078,210 A | * | 6/2000 | Uchida et al. ............... 327/530 |
| 6,285,608 B1 | * | 9/2001 | Roohparvar ................ 365/201 |
| 6,414,890 B2 | | 7/2002 | Arimoto |
| 6,490,210 B2 | | 12/2002 | Takase |
| 6,551,846 B1 | | 4/2003 | Furutani |
| 2002/0097619 A1 | | 7/2002 | Jacob |
| 2003/0052704 A1 | | 3/2003 | Fleury |
| 2003/0058717 A1 | | 3/2003 | Kawamoto |

* cited by examiner

Primary Examiner—Richard Elms
Assistant Examiner—N. Nguyen
(74) Attorney, Agent, or Firm—James L. Clingan, Jr.; Robert L. King

(57) ABSTRACT

A circuit provides a stress voltage to magnetic tunnel junctions (MTJs), which comprise the storage elements of a magnetoresitive random access memory (MRAM), during an accelerated life test of the MRAM. The stress voltage is selected to provide a predetermined acceleration of aging compared to normal operation. A source follower circuit is used to apply a stress voltage to a subset of the memory cells at given point in time during the life test. The stress voltage is maintained at the desired voltage by a circuit that mocks the loading characteristics of the portion of the memory array being stressed. The result is a closely defined voltage applied to the MTJs so that the magnitude of the acceleration is well defined for all of the memory cells.

18 Claims, 2 Drawing Sheets

US 6,894,937 B2

ACCELERATED LIFE TEST OF MRAM CELLS

FIELD OF THE INVENTION

This invention relates to MRAMs, and more particularly, to accelerated life test for MRAM cells.

RELATED ART

In the manufacturing of semiconductors, reliability is typically a very desirable characteristic and this is true for magnetoresistive random access memories (MRAMs). A difficulty in testing a semiconductor, including MRAMs, is that there may be a defect which will eventually cause a functional failure but which has not yet manifested itself in any functional way. Thus, ordinary functional testing does not identify the defect, which is sometimes called a latent defect. A common technique for helping to identify this latent defect is to increase the operating voltage beyond the ordinary operating voltage to generate enough stress on the defect to cause the defect to manifest itself as a functional problem. The functional problem is then detected through functional testing and the device is rejected. This type of testing has been applied to tunnel junctions, which MRAMs typically have, but in relatively small numbers. A difficulty, however, occurs when a relatively large memory needs to have each memory cell tested for latent defects.

Thus, there is a need for a technique for testing a relatively large MRAM array for latent defects.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a circuit provides a stress voltage to magnetic tunnel junctions (MTJs), which comprise the storage elements of a magnetoresitive random access memory (MRAM), during accelerated life test of the MRAM. The stress voltage is selected to provide a predetermined acceleration of aging compared to normal operation. The stress voltage is applied to a subset of the memory cells at given point in time during the life test. The stress voltage is maintained at the desired voltage by a circuit that mocks the loading characteristics of the portion of the memory array being stressed. This is better understood by reference to the drawings and the following description.

Figure 1:
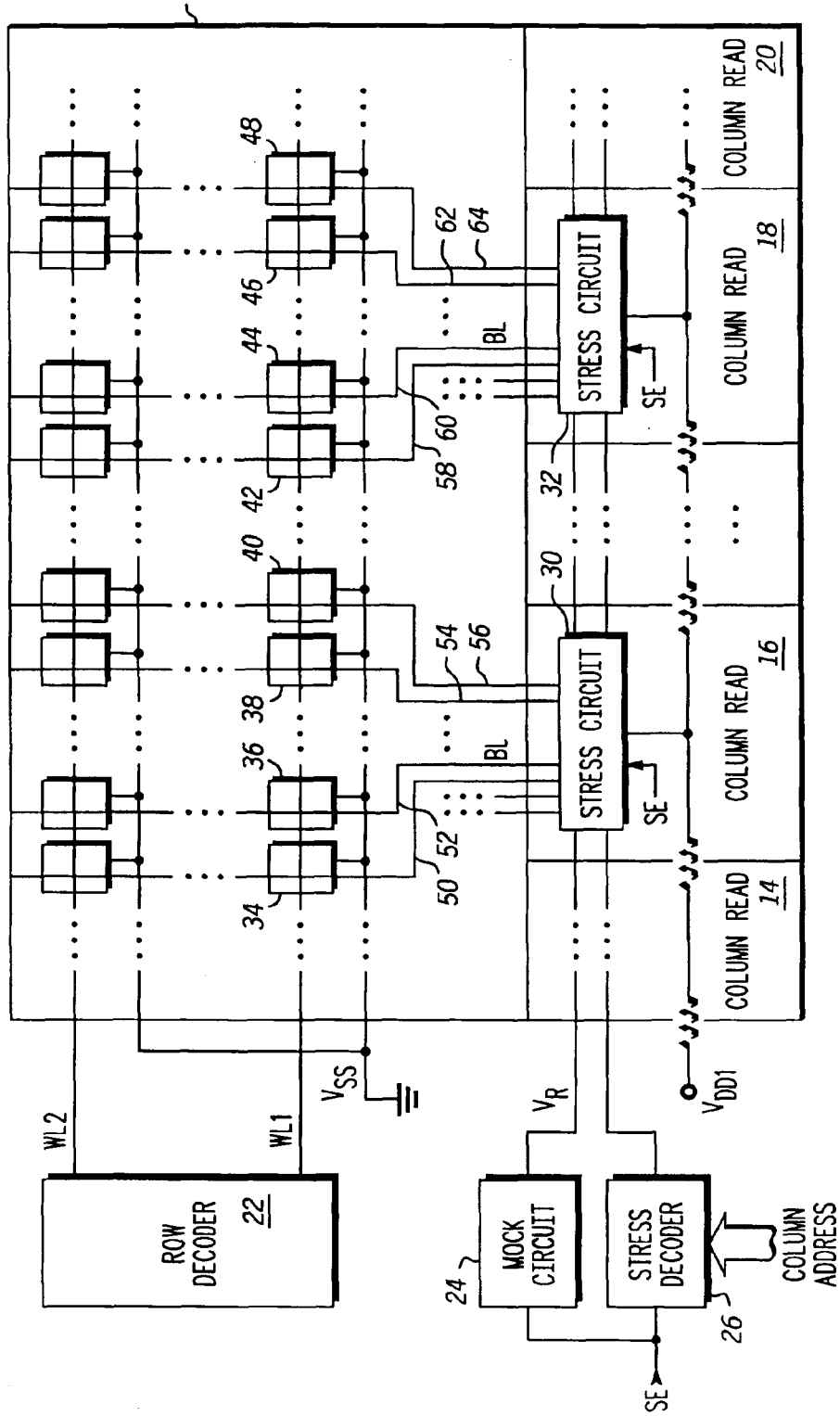
FIG. 1 is combination circuit and block diagram of a memory according to an embodiment of the invention.

Shown in FIG. 1 is a portion of a memory 10 having an array 12 of MRAM cells, a word line WL1, a word line WL2, a row decoder coupled to word lines WL1 and WL2, a mock circuit 24, a stress decoder 26, a column read circuit 14, a column read circuit 16, a column read circuit 18, and a column read circuit 20. Array 12 has memory cells 34, 36, 38, 40, 42, 44, 46, and 48 coupled to word line WL1 and bit lines 50, 52, 54, 56, 58, 60, 62, and 64, respectively. Another similar group of memory cells is coupled to word line WL2 and the same bit lines. Memory 10 may have many more memory cells which are not shown in the portion of FIG. 1. Also memory 10 may also have more or fewer column read circuits, and each column read circuit may have more bit lines which are not shown in FIG. 1. Column read circuits 14–20 each include sense amplifiers, stress circuits, and column decoders. Specifically shown is column read circuit 16 comprising a stress circuit 30 coupled to mock circuit 24, stress decoder 26, and bit lines 50, 52, 54, and 56 as well as other bit lines and is for receiving a stress enable signal SE. Similarly, Column read circuit 18 is shown having stress circuit 32 coupled to mock circuit 24, stress decoder 26, and bit lines 58, 60, 62, and 64 as well as other bit lines not shown and for receiving signal SE. Mock circuit 24 receives signal SE and provides reference voltage $V_R$ as an output. Stress decoder 26 receives signal SE and column addresses and has an output coupled to stress circuits 30 and 32 and others not shown.

Figure 2:
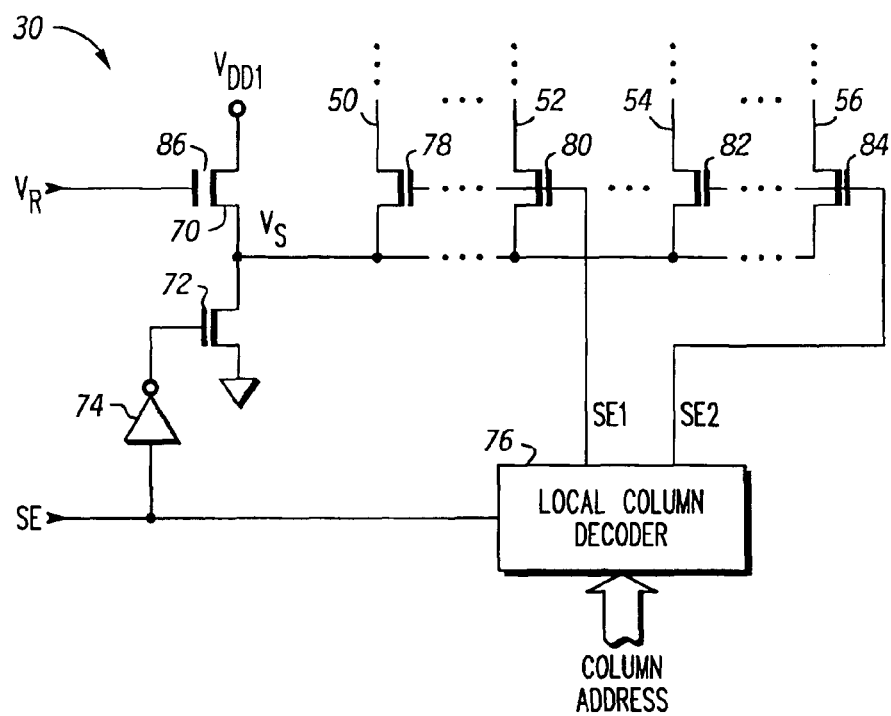
FIG. 2 is a combination circuit and block diagram of a portion of the memory of FIG. 1.

Shown in FIG. 2 is a more detailed diagram of stress circuit 30 comprising a transistor 70, transistor 72, inverter 74, transistor 78, transistor 80, transistor 82, transistor 84, and local column decoder 76. Transistor 70 a gate for receiving reference voltage $V_R$, and a source. Transistor 70 is shown as and is preferably a thick gate dielectric transistor, but it may also be transistor with a standard thickness for the gate dielectric. $V_{DD1}$ is for receiving higher voltage than is applied to most of the other transistors, for example 3.3 volts. Transistor 72 has a drain coupled to the source of transistor 70, a source coupled to ground, and a gate. Inverter 74 has an input for receiving signal SE and an output coupled to the gate of transistor 72. Transistor 78 has a source coupled to bit line 50, a drain coupled to the source of transistor 70, and a gate for receiving signal SE1. Transistor 80 has a source coupled to bit line 52, a drain coupled to the source of transistor 70, and a gate for receiving signal SE1. Transistor 82 has a source coupled to bit line 54, a drain coupled to the source of transistor 70, and a gate for receiving signal SE2. Transistor 84 has a drain coupled to bit line 56, a source coupled to the source of transistor 70, and a gate for receiving signal SE2. Local column decoder 76 receives the column addresses and signal SE and provides signals SE1 and SE2 as outputs. The source of transistor 70 provides stress voltage $V_S$.

Figure 3:
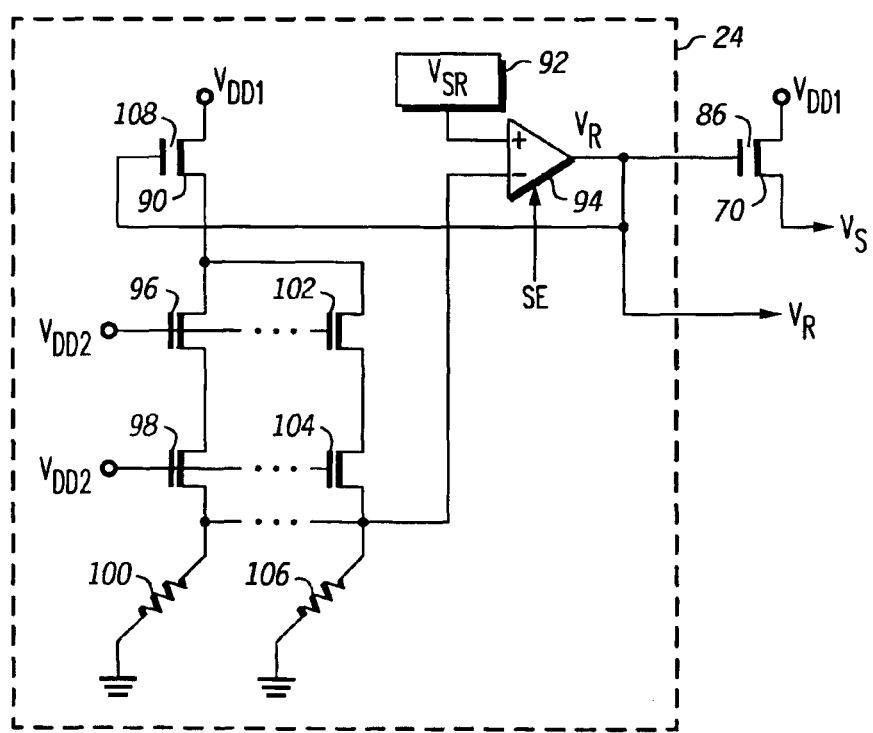
FIG. 3 is a circuit diagram of a portion of the memory of FIG. 2.

Shown in FIG. 3 is a circuit diagram of mock circuit 24 and transistor 70. Mock circuit 24 comprises a stress reference circuit 92, an operational amplifier 94, transistors 90, 96, 102, 98, and 104, and MTJs 100 and 106. Reference circuit 92 provides a stress reference voltage $V_{SR}$ as an output. Operational amplifier 94 has a non-inverting input for receiving stress reference voltage $V_{SR}$, an inverting input, and an output. Transistor 90 has a drain a coupled to $V_{DD1}$, a gate coupled to the output of operational amplifier 94, and a source. Transistor 96 has drain coupled to the source of transistor 90, a gate coupled to a positive power supply terminal $V_{DD2}$ that is for supplying lower voltage than is supplied at $V_{DD1}$, and a source. Transistor 102 has drain coupled to the source of transistor 90 and the source of other transistors not shown, a gate coupled to a positive power supply terminal $V_{DD2}$, and a source. Transistor 98 has drain coupled to the source of transistor 96, a gate coupled to $V_{DD2}$, and a source. Transistor 104 has drain coupled to the source of transistor 102, a gate coupled to $V_{DD2}$, and a source. MTJ 100 has a first terminal coupled to the source of transistor 98 and a second terminal coupled to ground. MTJ 106 has a first terminal coupled to sources of transistors 98, 104, and of other transistors not shown and the inverting input of operational amplifier 94 and a second terminal coupled to ground. The output of operational amplifier 94, which provides reference voltage $V_R$, is coupled to the gate of transistor 70 as well as the source-follower transistors of the other stress circuits such as stress circuit 32.

In operation, a life test is performed by cycling through the memory cells of memory 10 by sequentially applying the stress voltage to subsets of the MRAM cells. For a subset comprised of memory cells 34, 36, 42, and 44, word line WL1 is enabled and bit lines 50, 52, 58, and 60 are selected. A stress enable signal is externally provided to disable transistor 72 and to cause local column decoder 76 to provide signal SE1 at a logic high. With signal SE1 at a logic high, transistors 78 and 80 are enabled. Signal SE also activates operational amplifier 94 so that reference voltage $V_R$ is applied to the gate of transistor 70. With transistor 70 in the source-follower configuration, the voltage present at the source of transistor 70, the stress voltage $V_S$ is approximately one threshold voltage below the voltage of reference voltage $V_R$. With transistors 78 and 80 conductive, stress voltage $V_S$ is coupled to bit lines 50 and 52. With word line WL1 enabled, stress voltage $V_S$ is applied to the MTJs of memory cells 34 and 36. Similarly, stress circuit 32 applies the stress voltage $V_S$ to the MTJs of memory cells 42 and 44. Shown is the selection of two adjacent memory cells 34 and 36 being stressed at the same time. In practice a different number of adjacent memory cells may be stressed simultaneously. For example, eight has been found to be an effective number.

Mock circuit 24 provides reference voltage $V_R$ at the voltage which results in the desired stress voltage being applied to the MTJs of the memory cells. Operational amplifier 94 has its positive input for receiving the stress reference voltage $V_{SR}$, which is selected to be the voltage that is desired to be applied to the MTJs of the memory cells during the accelerated life test. The voltage applied to the MTJs is what determines the amount of acceleration in the accelerated life test. The amount of acceleration is very sensitive to small changes in the stress voltage applied to the MTJs. The amount of acceleration has been found to be between 20 and 40 per increase in voltage of 100 millivolts (mV). Thus, an effective accelerated life test of more than 10 years can be achieved with an increase in 600 mV from normal operation. In such case, stress reference voltage is chosen to be 600 mV in excess of the normal operating voltage of the MTJs.

In operation, the output of mock circuit 24 feeds back to transistor 90 which is made to be similar to transistor 70, which puts the voltage at the source of transistor 90 at approximately one threshold voltage below the output voltage of operational amplifier 94. The voltage at the source of transistor 90 is applied to the drains of transistors 96 and 102 as well as other transistors not shown. The total number of such transistors matches the drive strength ratio of transistor 90 to transistor 70 times the number of bit lines being driven by transistor 70. For example, if the width of transistor 70 is 20 microns, the width of transistor 90 is 10 microns and transistor 70 drives 8 bit line, then transistor 90 drives 4 bit lines. Transistors 96 and 102 are made to be the same as transistors 78 and 80. Transistor 98 and MTJ 100 and transistor 104 and MTJ 106, as well as other transistor/MTJ pairs not shown, comprise memory cells that are built the same as the memory cells of array 12. The voltage on MTJs 100 and 106 is applied to the negative input of operational amplifier 94 which has the effect, due to conventional operational amplifier feedback operation, of forcing the voltage on MTJs 100 and 106 to be the same as the voltage of stress reference voltage $V_{SR}$. Thus, the reference voltage $V_R$, which is the output of mock circuit 24, is the voltage that will result in the stress voltage applied to the MTJs of the memory cells of array 12 matching the stress reference voltage $V_{SR}$.

To achieve the stressing of all the memory cells of the whole array 12, groups of memory cells are sequentially selected until the whole array 12 has received the stress voltage. In the example described, stress circuits 30 and 32 each provided stress to eight memory cells, two of which are shown in FIG. 1 for both stress circuit 30 and 32. After those memory cells are stressed other groups of memory cells are selected for stressing. One way is to change the selected stress circuits. Another way is for the selected stress circuits to change the bit lines that receive the stress voltage. This is shown as being achieved by changing from enabling signal SE1 to signal SE2. Yet another alternative is to change the selected row. This is shown as being achieved by row decoder 22 changing the selected word line from word line WL1 to WL2 while keeping the selected stress circuits 30 and 32 unchanged.

The connection of $V_{DD1}$ to stress circuits 30 and 32 is shown has having a distributed resistance, which is true of all lines, but is particularly significant to the $V_{DD1}$ line. This $V_{DD1}$ line is in the crowded periphery that has more resistance than the VSS line, which is actually a plane with holes in it, in array 12. This distributed resistance of the $V_{DD1}$ line is significant because of the potential voltage drop due to current flowing through stress circuits 30 and 32. This current results in a difference in the $V_{DD1}$ voltage level applied to stress circuit 30 compared to that of stress circuit 32. Because stress circuits 30 and 32 each have a source-follower, such as transistor 70, then the output voltage is not dependent upon the voltage level of $V_{DD1}$. Moreover, $V_{DD1}$ is significantly higher voltage than that of $V_{DD2}$. This is possible because transistor 70 has a significantly thicker gate dielectric 86 than that of the other regular transistors such as the transistors that are used as the select transistors of the memory cells. Exemplary regular transistors are transistors 98 and 104, which are the same as the select transistors in array 12. In this case, the gate dielectric 86 of transistor 70, as well as the other source-followers of the other stress circuits and mock circuit 24, is preferably about 70 Angstroms with the regular transistors being about 35 Angstroms. Other thicknesses could also be used. The extra thickness of the source-followers allows for the use of a higher voltage for $V_{DD1}$ than for $V_{DD2}$. This allows for a larger stress voltage that is also able to be held relatively constant for all of the MTJs being stressed.

In the foregoing specification, the invention has been described with reference to specific embodiments. However, one of ordinary skill in the art appreciates that various modifications and changes can be made without departing from the scope of the present invention as set forth in the claims below. For example, Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A memory, comprising:
   rows and columns of conductors having a memory cell at each intersection thereof; and
   a voltage stress circuit for accelerated life testing of a portion of the plurality of memory cells that is coupled to selected memory cells at a predetermined row and selected columns of the memory, the voltage stress circuit comprising a source follower circuit portion to control a stress voltage that is applied across one or more of the portion of the plurality of memory cells, the source follower circuit portion receiving a reference voltage and coupling the stress voltage as a substantially constant voltage to each of the selected memory cells.

2. The memory of claim 1 further comprising:
   a mock circuit having one or more mock memory cells implemented on a same integrated circuit as the plurality of memory cells, the mock circuit further comprising:
      a source follower transistor coupled to each of the one or more mock memory cells, the source follower transistor being biased by a feedback control signal; and
      an operational amplifier having a first input for receiving a stress reference voltage, a second input for receiving a mock stress voltage applied across each of the one or more mock memory cells by the source follower transistor, and an output coupled to the source follower transistor, the output providing the feedback control signal that also functions as the reference voltage.

3. The memory of claim 2 further comprising:
   impedance means coupled between the source follower transistor and each of the one or more mock memory cells, the impedance means duplicating an impedance path within selected portions of the selected columns of the memory.

4. The memory of claim 3 wherein the impedance means further comprises a plurality of select transistors coupled between the source follower transistor and each of the one or more mock memory cells.

5. The memory of claim 2 wherein the stress reference voltage comprises a desired voltage to apply to a tunnel junction of each of the selected memory cells.

6. The memory of claim 2 wherein each of the source follower circuit portion and the source follower transistor further comprise a transistor having a transistor gate oxide that is thicker than gate oxides of transistors implemented in the memory cells to permit higher voltage operation.

7. The memory of claim 1 wherein the plurality of memory cells are magnetoresistive random access memory cells having at least two distinct resistive states and the stress voltage is applied to a magnetic tunnel junction of each of the plurality of memory cells.

8. A method of accelerating life testing of a memory having rows and columns of conductors, the memory having a plurality of memory cells, each memory cell formed at an intersection of a predetermined row and a predetermined column of conductors, comprising:

using a first source follower circuit to generate a constant voltage from a supply voltage that is susceptible to voltage variation;

applying the constant voltage to one or more mock memory columns, each having a mock memory cell;

including within the one or more mock memory columns duplicated impedances that are present in each of the columns of conductors;

comparing with an operational amplifier circuit a voltage across one or more mock memory cells to a stress reference voltage determined to be appropriate for the life testing to provide a reference voltage as an output of the operational amplifier;

coupling the reference voltage as feedback to bias the first source follower circuit;

using the feedback to adjust the voltage across the one or more mock memory cells to a desired value that compensates for a portion of parasitic losses in the memory;

coupling the reference voltage to a second source follower circuit, to generate a stress voltage; and coupling the stress voltage to a portion of the memory for use in accelerated life testing.

9. The method of claim 8 further comprising:
   implementing the plurality of memory cells as magnetoresistive random access memory cells having at least two resistance states.

10. The method of claim 8 further comprising:
    coupling the stress voltage to a tunnel junction of each memory cell of the portion of the memory subject to accelerated life testing.

11. The method of claim 8 further comprising:
    implementing each of the first source follower circuit and the second source follower circuit with transistors having transistor gate oxides that are thicker than gate oxides of transistors implemented in the memory cells to permit higher voltage operation.

12. The method of claim 8 wherein including duplicated impedances within the one or more mock memory columns further comprise:
    coupling one or more transistors between the first source follower circuit and each mock memory cell in the one or more mock memory columns, the one or more transistors duplicating one or more select transistors that are located in the memory between the second source follower and selected memory cells of the plurality of memory cells, the one or more transistors compensating for parasitic effects in the memory.

13. A method of accelerating life testing of a memory having rows and columns of conductors, the memory having a plurality of memory cells, each memory cell formed at an intersection of a predetermined row and a predetermined column of conductors, comprising:
    coupling a reference voltage to a first source follower circuit, to generate a stress voltage of substantially constant value that compensates for a portion of parasitic impedances existing within each of the columns of conductors; and
    coupling the stress voltage to a portion of the memory for use in accelerated life testing.

14. The method of claim of claim 13 further comprising:
    coupling a mock circuit to the memory for generating the reference voltage;
    providing a second source follower circuit within the mock circuit to generate a constant voltage;

applying the constant voltage to one or more mock memory columns, each having a mock memory cell;

including within the one or more mock memory columns duplicated impedances that are present in each of the columns of conductors;

comparing with an operational amplifier circuit a voltage across one or more mock memory cells to a stress reference voltage determined to be appropriate for the life testing to provide a reference voltage as an output of the operational amplifier;

coupling the reference voltage as feedback to bias the second source follower circuit; and using the feedback to adjust the voltage across the one or more mock memory cells to a desired value that compensates for a portion of parasitic losses in the memory.

15. The method of claim 14 further comprising:

implementing each of the first source follower and the second source follower with a transistor having a gate oxide that is thicker than gate oxides of transistors within the plurality of memory cells in the memory.

16. The method of claim 14 wherein including duplicated impedances within the one or more mock memory columns further comprise:

coupling one or more transistors between the second source follower circuit and each mock memory cell in the one or more mock memory columns, the one or more transistors duplicating one or more select transistors that are located in the memory between the first source follower and selected memory cells of the plurality of memory cells, the one or more transistors compensating for parasitic effects in the memory.

17. The method of claim 13 further comprising:

implementing the plurality of memory cells as magnetoresistive random access memory cells having at least two resistance states.

18. The method of claim 13 further comprising:

coupling the stress voltage to a tunnel junction of each memory cell of the portion of the memory that is subject to accelerated life testing.

* * * * *